US008924170B2

(12) United States Patent
Bengtsson et al.

(10) Patent No.: US 8,924,170 B2
(45) Date of Patent: Dec. 30, 2014

(54) METHOD AND SYSTEM FOR DETECTING A FAILED RECTIFIER IN AN AC/DC CONVERTER

(71) Applicants: Tord Bengtsson, Vasteras (SE); Stefan Roxenborg, Vasteras (SE)

(72) Inventors: Tord Bengtsson, Vasteras (SE); Stefan Roxenborg, Vasteras (SE)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 14/229,279

(22) Filed: Mar. 28, 2014

(65) Prior Publication Data

US 2014/0214343 A1 Jul. 31, 2014

Related U.S. Application Data

(63) Continuation of application No. PCT/EP2011/068486, filed on Oct. 21, 2011.

(51) Int. Cl.
*G01R 31/00* (2006.01)
*G01R 31/40* (2014.01)
*H02H 7/125* (2006.01)
*H02M 7/06* (2006.01)
*H02M 7/162* (2006.01)

(52) U.S. Cl.
CPC .............. *G01R 31/40* (2013.01); *H02H 7/1255* (2013.01); *H02M 7/066* (2013.01); *H02M 7/1623* (2013.01)
USPC .......................................................... 702/58

(58) Field of Classification Search
None
See application file for complete search history.

(56) References Cited

U.S. PATENT DOCUMENTS

| 4,156,845 | A | 5/1979 | Muellner et al. |
| 4,178,546 | A | 12/1979 | Hulls et al. |
| 5,508,601 | A | 4/1996 | Good et al. |
| 5,523,938 | A | 6/1996 | Wagner et al. |
| 6,342,761 | B1 | 1/2002 | Reber |
| 7,746,038 | B2 | 6/2010 | Maddali et al. |
| 2004/0095121 | A1* | 5/2004 | Kernahan et al. ............. 323/283 |
| 2010/0066551 | A1 | 3/2010 | Bailey et al. |

FOREIGN PATENT DOCUMENTS

EP 03988850 A2 9/1990
JP 2001275247 A 10/2001

OTHER PUBLICATIONS

International Search Report & Written Opinion of the International Searching Authority Application No. PCT/EP2011/068486 Completed: Sep. 10, 2012; Mailing Date: Sep. 19, 2012 10 pages.

* cited by examiner

*Primary Examiner* — Aditya Bhat
(74) *Attorney, Agent, or Firm* — St. Onge Steward Johnston & Reens LLC

(57) ABSTRACT

A device for detecting a failed rectifier in an AC/DC converter for converting three-phase AC power to DC power and having its AC side connected to a three-phase AC source and its DC side connected to a DC load, the AC/DC converter including a rectifier circuit including at least three legs, each of the legs connected to a corresponding AC phase and including at least one rectifier, the device including a measuring unit for measuring and sampling AC current for each of the phases and a calculating unit configured to estimate an instantaneous DC current based on the measured instantaneous AC currents during one period of the power supply frequency.

12 Claims, 4 Drawing Sheets

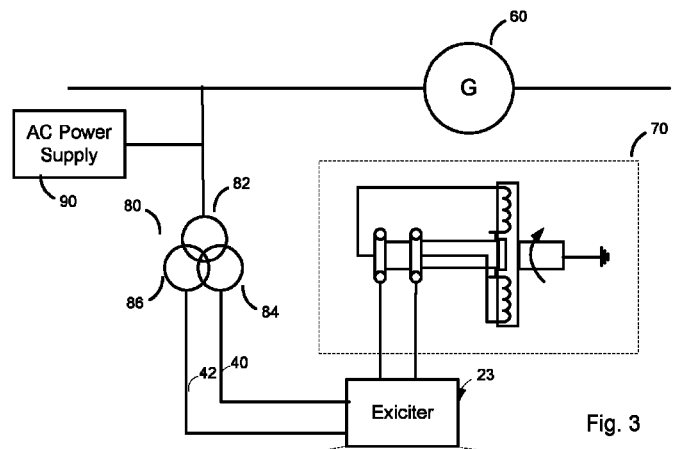
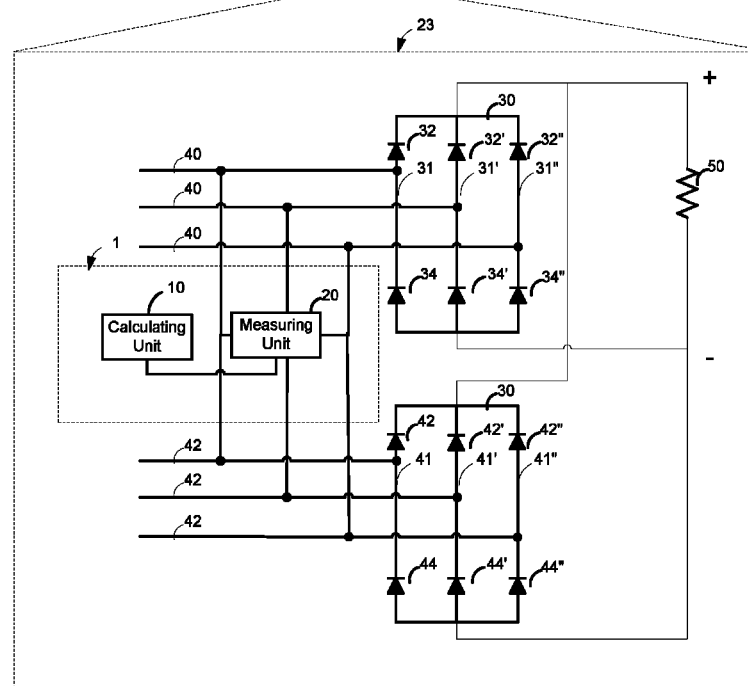
Fig. 3
Fig. 3a

METHOD AND SYSTEM FOR DETECTING A FAILED RECTIFIER IN AN AC/DC CONVERTER

FIELD OF THE INVENTION

The present invention relates to the field of detecting a failed rectifier in an AC/DC converter for converting three-phase AC power to DC power. The AC/DC converter including a rectifier circuit that has its AC side connected to an AC source for power supply and its DC side connected to a DC load and includes at least three legs, wherein each of the legs is connected to a corresponding AC phase and including at least one rectifier. The present invention relates also to an excitation system used in a synchronous rotating electrical machine for exciting the rotor of the synchronous rotating electrical machine, wherein the excitation system comprises an exciter including an AC/DC converter and a device for detecting a malfunctioned rectifier in the rectifier circuit of the AC/DC converter.

BACKGROUND OF THE INVENTION

An AC/DC converter converts alternating current (AC), which periodically reverses direction, to direct current (DC) which flows in only one direction. It is typically used in DC power supplies and high-voltage direct current power transmission systems. For example, in a power generator the voltage on the stator is built up on the terminal side by injecting a DC excitation current into the rotor windings while the rotor is rotating. The rotor winding is provided with DC excitation current through an AC/DC converter including a rectifier circuit and a power transformer. The rectifier circuit may comprise three legs, each of the legs connected to a corresponding AC phase and including at least one rectifier which is an essential component in the rectifier circuit for converting an AC voltage to a DC voltage. A rectifier may be either a diode or a thyristor.

In case of a rectifier fails in the rectifier circuit, e.g. a short-circuited or non-conductive diode/thyristor, the rotor system is extremely endangered. Therefore, there is a need to detect a malfunctioned rectifier when the AC/DC converter is operational.

US 2010/0066551 A1 describes a controller for diagnosing a power generation failure for a power circuit in an electric drive. The power circuit includes a rectifier circuit. To determine a failure of one of the diodes in the rectifier circuit that converts a three-phase AC power to DC power, it calculates the RMS phase current values of each of the 3-phases and then compares the ratio of the RMS phase current values of the phases. When the ratio exceeds a threshold, the controller determines that one of the current phases is unbalanced. This determination may be indicative that one of the diode legs of the rectifier circuit has malfunctioned. Additionally, the controller may attempt to isolate the particular diode that has failed. To perform such diagnosis, the controller determines in which of the legs of the rectifier current flow is in an opposite direction as compared to the remaining legs. The controller may perform other permutations of the three phase currents to make this determination. Using this approach, a short-circuited diode can be detected, whilst another type of fault, i.e. a non-conductive diode cannot be detected.

U.S. Pat. No. 5,508,601 discloses a shorted rectifying diode protection system which monitors the exciter field peak current protection circuit and the output generator voltage to sense the presence of the shorted rectifying diode. Using this solution, a non-conductive diode cannot be detected either.

SUMMARY OF THE INVENTION

One object of the present invention is to detect a malfunctioned rectifier in an AC/DC converter and determine the type of malfunction in the rectifier.

This object is achieved by a method for detecting a fault rectifier.

Such a method comprises measuring instantaneous AC currents of each of the phases, estimating an instantaneous DC current based on the measured instantaneous AC currents during one period of the power supply frequency, calculating a ripple value of the estimated instantaneous DC current, determining when the calculated ripple value exceeds a pre-defined threshold value, initiating an alarm upon the calculated ripple value exceeding the pre-defined threshold value, upon the calculated ripple value exceeding the pre-defined threshold value, for each of the legs calculating a rectifier status value based on a maximum instantaneous AC phase current and a minimum instantaneous AC phase current during the same one period, and determining for each of the legs if the rectifier in the leg has a non-conducting fault based on the calculated rectifier status value.

By non-conduction of a rectifier, it means that the rectifier prohibits electric current from flowing through the circuit. Such faults result in unbalanced voltages which consequently lead non-conduction of other rectifiers in the circuit. As such a fault accumulates the risk for serious damage in the vicinity increases.

When the calculated ripple value of an estimated instantaneous DC current exceeds a predefine threshold, there is an indication that there may be a faulty rectifier in the rectifier circuit. Type of the fault is either non-conductive or short-circuited. The estimated instantaneous DC is based on an instantaneous AC current of each of the phases during one period of the power supply frequency. To determine the fault type, a rectifier status value is calculated based on a maximum instantaneous AC phase current and a minimum instantaneous AC phase current during the same one period, the invention is able to detect if there is a non-conductive rectifier in the rectifier circuit.

Depending on circumstances, in the case that a non-conductive rectifier is detected, an operator/user may stop the operation and repair the circuit or he may alternatively run the operation under certain restrictions or switch to a reserve rectifier if available.

In one embodiment of the invention, in the case of the calculated ripple value exceeding the pre-defined threshold value and a non-conducting rectifier is not detected, for each of the legs, a DC component in the AC current is calculated based on measured instantaneous AC value of the phase and a short-circuited rectifier is determined and identified thereon.

In another embodiment of the invention, the method further comprises calculating a maximum DC current and a minimum DC current during the same one period and calculating the ripple value in percent of the estimated DC current based on the calculated maximum and minimum instantaneous DC currents.

Alternatively, the method further comprises calculating an average DC current based on the measured instantaneous AC currents during the same one period and calculating the ripple value in percent of the estimated DC current based on the calculated maximum and minimum instantaneous DC currents and the calculated average DC current.

This object is achieved by a device for detecting a failed rectifier.

Such a device includes a measuring unit for measuring and sampling AC currents for each of the phases and a calculating unit. The calculating unit is configured to estimate an instantaneous DC current based on the measured instantaneous AC currents during one period of the power supply frequency, calculate a ripple value of the estimated instantaneous DC current, determine if the calculated ripple value exceeds a pre-defined threshold value, initiate an alarm upon the calculated ripple value exceeding the pre-defined threshold value, upon the calculated ripple value exceeding the pre-defined threshold value, for each of the legs, calculate a rectifier status value based on a maximum instantaneous AC phase current and a minimum instantaneous AC phase current during the same one period, and determine, for each of the legs, if the rectifier in the leg has a non-conducting fault based on the calculated rectifier status value.

According to one embodiment of the invention, the calculating unit is further configured to, upon the calculated ripple value exceeding the pre-defined threshold value and no non-conducting rectifier detected, for each of the legs, calculate an DC component in the AC current based on measured instantaneous AC value of the phase, and determine and identify, for each of the legs, if the rectifier is short-circuited based on the calculated DC component.

According to one embodiment of the invention, the calculating unit is further configured to calculate a maximum DC current and a minimum DC current during the same one period and calculate the ripple value in percent of the estimated DC current based on the calculated maximum and minimum instantaneous DC currents.

Alternatively, the calculating unit is further configured to calculate an average DC current based on the measured instantaneous AC currents during the same one period and calculating the ripple value in percent of the estimated DC current based on the calculated maximum instantaneous and minimum instantaneous DC currents and the calculated average DC current.

Such a device may be used in an excitation system for exciting a synchronous rotating electrical machine, wherein the synchronous rotating electrical machine has a rotor, wherein the excitation system comprises a transformer having a primary winding and a secondary winding and an exciter for exciting the rotor of the synchronous rotating electrical machine and comprising an AC/DC converter including at least three legs and each of the legs has an AC input connected to the secondary winding and a DC output connected to the rotor and, each of the legs includes at least one rectifier. The excitation system further comprises a device for detecting a malfunctioned rectifier in the AC/DC converter.

According to one embodiment of the invention, the measuring unit of the device is further configured to measure instantaneous AC current at either the primary winding or the secondary winding.

In a case that the transformer further comprises a tertiary winding and each of three additional legs of the rectifier circuit has an AC input connected to the tertiary winding and the DC output connected to the rotor. The measuring unit is further configured to measure instantaneous AC current at both the secondary winding and the tertiary winding. Alternatively, the measuring unit may be configured to only measure instantaneous AC current at the primary winding.

According to another embodiment of the invention, the excitation system may comprise a second transformer having a primary winding and a secondary winding, wherein each of three additional legs of the rectifier circuit has an AC input connected to the secondary winding of the second transformer and a DC output connected to the rotor, and each of the additional three legs comprises at least one rectifier, and the measuring unit is further configured to measure instantaneous AC current flowing through the winding of the second transformer at the same side as the first transformer.

BRIEF DESCRIPTION OF THE DRAWINGS

The invention will now be explained more closely by the description of different embodiments of the invention and with reference to the appended figures.

FIGS. 3-3a illustrate a schematic diagram of an excitation system for exciting a synchronous rotating electrical machine including an exciter as shown in FIG. 3a, according to a fourth embodiment of the invention, wherein the transformer is a three winding transformer.

DETAILED DESCRIPTION OF THE INVENTION

The invention may be applied in AC/DC rectifier circuits having different rectifier configuration.

Figure 1A:
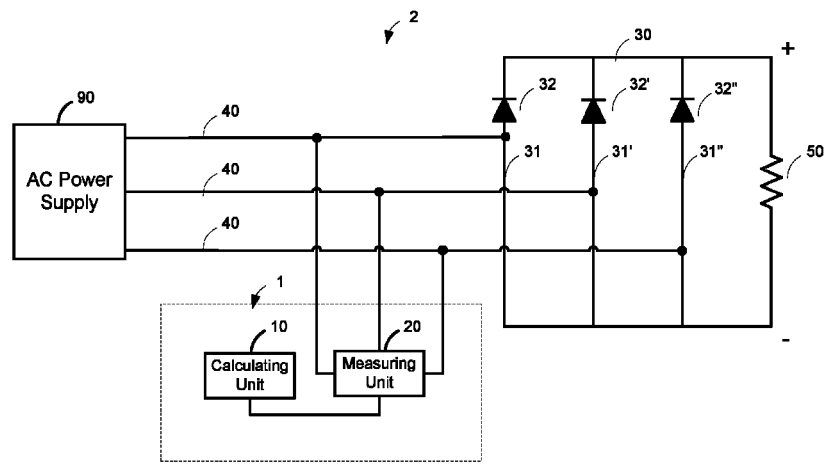
FIGS. 1a-b show schematic diagrams of the invention, according to first and second embodiments of the invention, wherein rectifier circuits are a three-phase half-wave three pulse and a three-phase full-wave 6 pulse respectively.
Figure 1B:
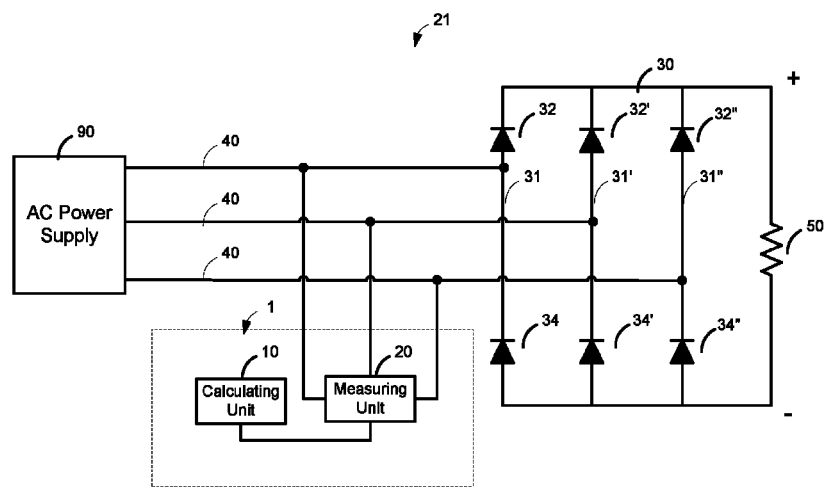

FIGS. 1a-b show two configurations of an AC/DC converter. FIG. 1a shows a three-phase half-wave rectifier circuit 30 having its AC side connected to a AC power source 90 with three phases 40, wherein each of the legs 31, 31', 31" of the circuit is connected to a corresponding AC phase and including at least one rectifier 32, 32', 32". The DC side of the circuit is connected to a DC load impedance 50. In FIG. 1b two rectifiers, a positive 32, 32', 32" diode and a negative 34, 34', 34" diode are arranged in each of the legs 31, 31', 31". The corresponding AC phase 40 is connected in between the positive 32, 32', 32" diode and a negative 34, 34', 34" diode of the leg. Therefore, it is a three-phase full wave 6 pulse converter.

Regardless of the configuration of a converter, a device 1 of the present invention may be adapted for detecting a malfunctioned rectifier in the circuit. The device 1 comprises a measuring and sampling unit 20 and a calculating unit 10.

Figure 4:
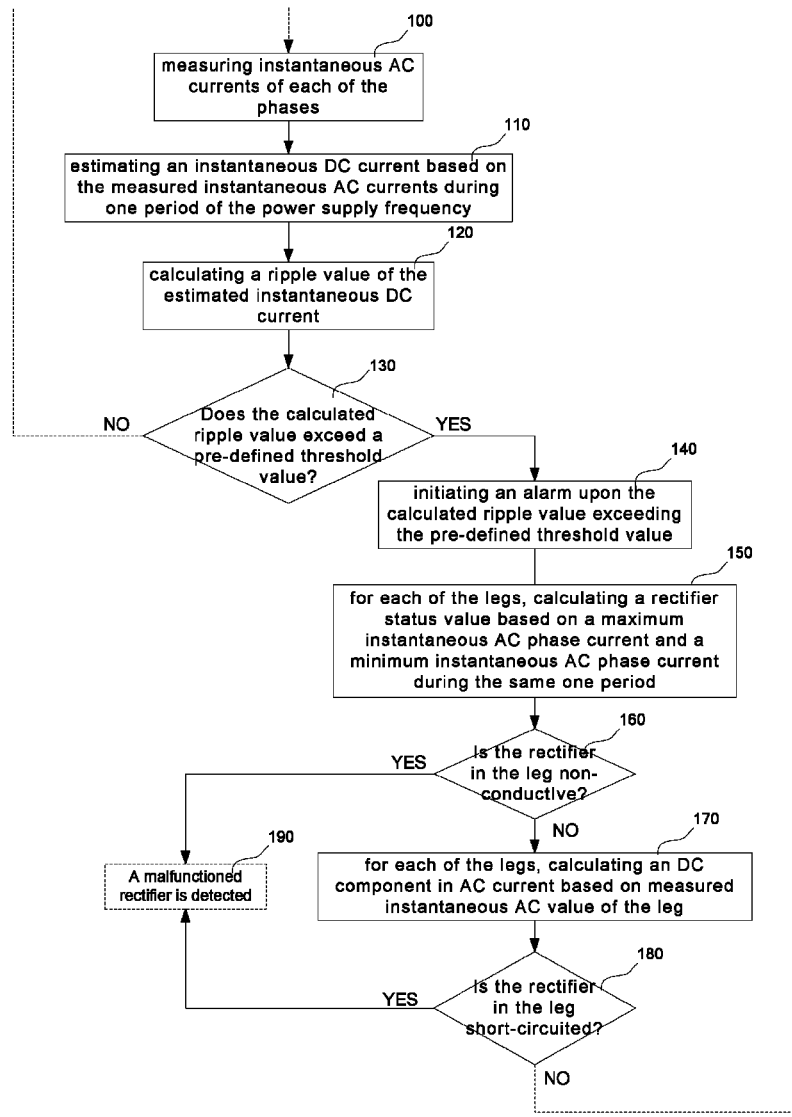
FIG. 4 shows a flow chart of the invention, according to an embodiment of the invention.

With reference to FIG. 4, the measuring and sampling unit 20 is configured for measuring and sampling AC current for each of the phases, step 100. The measured values are communicated to the calculating unit 10. The calculating unit 10 is configured to estimate an instantaneous DC current based on the measured instantaneous AC currents during one period of the power supply frequency, step 110. The instantaneous DC current may be estimated as follows, $$i_{DC} = \frac{|i_1| + |i_2| + |i_3|}{2}$$

wherein, $|i_1|$, $|i_2|$ and $|i_3|$ are absolute values of the measured samples of the instantaneous AC currents measured in of each of the phases 40 respectively.

To be able to detect a malfunctioned rectifier, the calculating unit 10 is further configured to calculate a ripple value of the estimated instantaneous DC current, step 120 and thereon determine whether the calculated ripple value exceeds a pre-defined threshold value, step 130. Because a non-conductive rectifier may not always result in asymmetry in phase currents, the ripple value in percent of the estimated DC current is calculated, which may be based on a maximum DC current $i_{DC\_MAX}$ and a minimum DC current $i_{DC\_MIN}$ during the same one period at which AC current of each of the phases are measured and an instantaneous DC current are calculated thereof, wherein the maximum DC current $i_{DC\_MAX}$ and the minimum DC current $i_{DC\_MIN}$ may be respectively determined as follows, $$i_{DC\_MAX} = \max_n \{i_{DC}\}$$

$$i_{DC\_MIN} = \min_n \{i_{DC}\}$$

wherein n corresponds the number of instantaneous AC current samples during one period of the power supply frequency.

Preferably, the ripple value may be calculated in percentage. There are several ways to calculate the ripple value in percent of the estimated DC current based on the maximum DC current $i_{DC\_MAX}$ and the minimum DC current $i_{DC\_MIN}$. For example, one way may be as follows, $$rippleValuePercent = 100 * \frac{(i_{DC_{MAX}} - i_{DC\_MIN})}{0.5*(i_{DC_{MAX}} + i_{DC\_MIN})}$$

It may be alternatively calculated as follows, $$rippleValuePercent = 100 * \frac{(i_{DC_{MAX}} - i_{DC\_MIN})}{\bar{i}_{DC}}$$

wherein, $\bar{i}_{DC}$ is an average DC current of the instantaneous DC current in the same one period.

Upon the calculated ripple value exceeding the pre-defined threshold value, an alarm is initiated, step 140.

Further on, for each of the legs/phase, a rectifier status value based on a maximum instantaneous AC phase current and a minimum instantaneous AC phase current during the same one period is calculated, step 150 to determine whether the rectifier in the leg has a non-conducting fault based on the calculated rectifier status value, step 160.

An example of such calculations is demonstrated as follows. Assuming that $i_1$, $i_2$, $i_3$ represent samples of instantaneous phase current, a maximum instantaneous phase current value for each of the phases in the same one period is determined as follows, $$i_{MAX\_L_k} = \max_n \{i_k\}$$

wherein n is the number of the instantaneous AC current samples during the same one period of the power supply frequency, k=1, 2, 3 represents one of the three phases. Therefore, $i_{MAX\_L_k}$ represents the maximum instantaneous phase current sample value in the period of the phase k. Analogously, the minimum instantaneous phase current sample value $i_{MIN\_L_k}$ in the period of the phase k can be determined.

Based on the maximum and the minimum instantaneous phase current sample values, a rectifier status value for each phase is then determined as follows, $$rectifierStatusValue_k = \frac{i_{MAX\_L_k}}{(i_{MAX_{L_k}} - i_{MIN\_L_k})}$$

wherein k=1, 2, 3.

In principle, a non-conductive rectifier will result in a missing pulse in a failed phase.

For the configuration of the rectifier circuit shown in FIG. 1b, if the rectifierStatusValue is in a range of 0.75 to 1.25, then the negative rectifier has a non-conductive fault, whereas if it is in a range of −0.25 to 0.25, the positive rectifier has a non-conductive fault, step 190. This is because that in a non-faulty circuit, $$i_{MIN\_L_k} = -i_{MAX_{L_k}}$$

which leads to rectifierStatusValue=0.5. If a negative rectifier has a non-conductive fault, the minimum phase current will be zero, which leads that rectifierStatusValue of the negative rectifier will be one. Similarly, if a positive rectifier has non-conductive fault, the maximum phase current will be zero, which leads that rectifierStatusValue will be zero.

In the case that if a rectifier has a non-conductive fault, a signal may set and a counter measure may be taken, for example, one may then stop and repair, run under restrictions or switch to a reserve rectifier, if available.

Upon the calculated ripple value exceeding the pre-defined threshold value and no non-conducting rectifier detected, for each of the legs, a DC component in AC current based on measured instantaneous AC values of the phase is calculated, step 170. A short-circuited rectifier of the leg is thereof determined and identified based on the calculated DC component. The DC component in the AC current of a leg/phase may be an average value of the sampled AC instantaneous current values in the same period, as calculated as follows, $$i_{AVE\_L_k} = ave_n \{i_k\}$$

With reference to FIG. 1b, if the DC component of one phase is positive and the other two are negative, a short-circuited fault occurs in the negative rectifier of the leg connected to the phase that has a positive DC component. If the DC component of one phase is negative and the other two are positive, a short-circuited fault occurs in the positive rectifier of the leg connected to the phase that has a negative DC component, step 190. In the case that if a rectifier has a short-circuited fault, a signal may set and a similar counter measure may be performed as for a non-conductive rectifier.

The rectifiers shown in FIGS. 1a and 1b are diodes; they may however be thyristors. Furthermore, the rectifier circuits may have other configurations, for example, a three-phase full-wave 12 pulse circuit.

The calculating unit 10 can be, for example, a micro-computing processor, a digital signal processor, a field-programmable gate array, or a standard computer.

The present invention may be applied in an excitation system for exciting a synchronous rotating electrical machine including a rotor 70 and a stator 60. The synchronous rotating electrical machine may be a synchronous generator or a synchronous motor.

Figure 2:
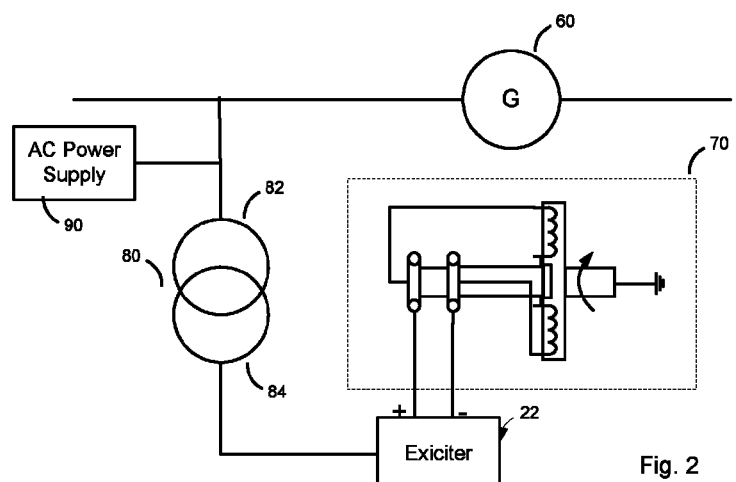
FIGS. 2-2a illustrate a schematic diagram of an excitation system for exciting a synchronous rotating electrical machine including an exciter as shown in FIG. 2a, according to a third embodiment of the invention, wherein the exciter includes a device of the present invention.
Figure 2A:
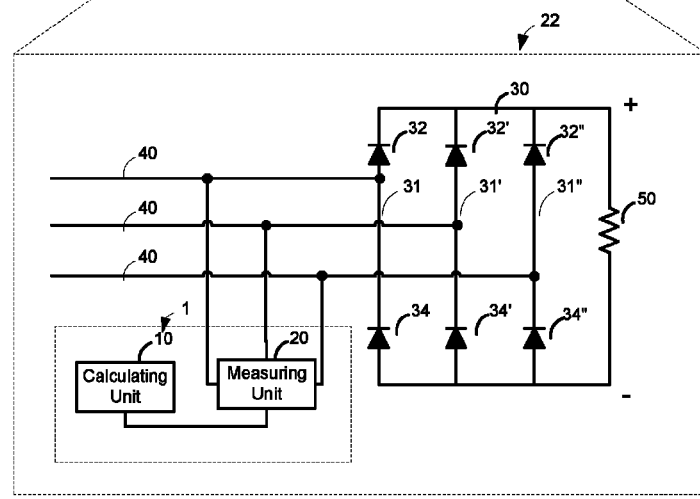

FIG. 2 illustrates a schematic diagram of such an application, wherein the excitation system comprises a transformer 80 having a primary winding 82 and a secondary winding 84 and an exciter 22 for exciting the rotor 70 of the synchronous rotating electrical machine. Furthermore, an AC power supply 90 is configured to supply AC power with a frequency to the exciter 22. The transformer is connected between the AC power supply 90 and the exciter 22 for transforming the supplied AC power. With reference to FIG. 2a, the exciter 22 comprises an AC/DC converter including a rectifier circuit 30 having three legs, each of the legs has an AC input 40 connected to the secondary winding 84 of the transformer and the DC output of the circuit connected to the rotor 70, each of the legs 31, 31', 31" includes a positive diode 32, 32', 32" and a negative diode 34, 34' 34". A DC load impedance 50 is connected to the positive output and negative output of the circuit, which is further connected to the rotor. The positive diodes 32, 32' 32" are connected to the positive output of the rectifier circuit at one end and the negative diodes 34, 34', 34" are connected to the negative output of the circuit at the other end. Two ends are further connected to the rotor. The excitation system further comprises a device 1 for detecting a malfunctioned rectifier in the rectifier circuit. In this example, the measuring unit 20 is connected to the secondary winding 84 for measuring instantaneous AC phase currents. It is however possible to perform measurement at the primary winding 82 of the transformer 80.

With reference to FIG. 3 and FIG. 3a, the transformer 80 may further comprise a tertiary winding 86. The rectifier circuit 30 includes three additional legs 41, 41', 41" which have their AC inputs connected to the tertiary winding and the DC output connected to the rotor. Each of the additional legs includes a positive diode 42, 42', 42" and a negative diode 44, 44', 44". The positive diodes 42, 42' 42" are connected to the positive output of the rectifier circuit at one end and the negative diodes 44, 44', 44" are connected to the negative output of the circuit at the other end. Therefore, if the tertiary winding is connected to obtain a suitable (±30°) phase shift to the secondary winding, the AC/DC converter has a three-phase full-wave 12 pulse rectifier circuit. The measuring unit 20 is further configured to measure instantaneous AC current at the tertiary winding 86 if it is configured to measure instantaneous AC current at the secondary winding 84. Alternatively, the measuring unit 20 may be arranged to measure the AC phase current at the primary winding 82.

It is also possible that such an excitation system may have a second transformer having a primary winding and a secondary winding, with a suitable phase shift to the first transformer, wherein each of three additional legs of the AC/DC converter has an AC input connected to the secondary winding of the second transformer and an DC output connected to the rotor, and each of the additional three legs comprises at least one rectifier, and the measuring unit is further configured to measure instantaneous AC current flowing through the winding of the second transformer at the same side as the first transformer.

What is claimed is:

1. A method for detecting a failed rectifier in an AC/DC converter for converting three-phase AC power to DC power and having its AC side connected to an AC source for power supply and its DC side connected to a DC load, the AC/DC converter including a rectifier circuit comprising at least three legs, each of the legs connected to a corresponding AC phase and including at least one rectifier, the method comprises
    measuring instantaneous AC currents of each of the phases,
    estimating an instantaneous DC current based on the measured instantaneous AC currents during one period of the power supply frequency,
characterized in that the method further comprises
    calculating a ripple value of the estimated instantaneous DC current,
    determining if the calculated ripple value exceeds a pre-defined threshold value,
    initiating an alarm upon the calculated ripple value exceeding the pre-defined threshold value,
    upon the calculated ripple value exceeding the pre-defined threshold value, for each of the legs, calculating a rectifier status value based on a maximum instantaneous AC phase current and a minimum instantaneous AC phase current during the same one period, and
    determining, for each of the legs, if the rectifier in the leg has a non-conducting fault based on the calculated rectifier status value.

2. The method according to claim 1, further comprising,
    upon the calculated ripple value exceeding the pre-defined threshold value and a non-conducting rectifier not detected, for each of the legs, calculating a DC component in AC current based on measured instantaneous AC value of the phase, and
    determining and identifying, for each of the legs, if the rectifier in the leg is short-circuited based on the calculated DC component.

3. The method according to claim 1, further comprising calculating a maximum DC current and a minimum DC current during the same one period and calculating the ripple value in percent of the estimated DC current based on the calculated maximum instantaneous and minimum instantaneous DC currents.

4. The method according to claim 3, further comprising calculating an average DC current based on the measured instantaneous AC currents during the same one period and calculating the ripple value in percent of the estimated DC current based on the calculated maximum instantaneous and minimum instantaneous DC currents and the calculated average DC current.

5. A device for detecting a failed rectifier in an AC/DC converter for converting three-phase AC power to DC power and having its AC side connected to a three-phase AC source and its DC side connected to a DC load, the AC/DC converter including a rectifier circuit comprising at least three legs, each of the legs connected to a corresponding AC phase and including at least one rectifier, the device including a measuring unit for measuring and sampling AC current for each of the phases and a calculating unit configured to estimate an instantaneous DC current based on the measured instantaneous AC currents during one period of the power supply frequency, characterized in that the calculating unit is further configured to,
    calculate a ripple value of the estimated instantaneous DC current,
    determine if the calculated ripple value exceeds a pre-defined threshold value,
    initiate an alarm upon the calculated ripple value exceeding the pre-defined threshold value,
    upon the calculated ripple value exceeding the pre-defined threshold value, for each of the legs, calculate a rectifier status value based on a maximum instantaneous AC phase current and a minimum instantaneous AC phase current during the same one period, and determine, for each of the legs, if the rectifier in the leg has a non-conducting fault based on the calculated rectifier status value.

6. The device according to claim 5, wherein the calculating unit is further configured to,
upon the calculated ripple value exceeding the pre-defined threshold value and a non-conducting rectifier not detected, for each of the legs, calculate a DC component in the AC current based on measured instantaneous AC value of the phase, and
determine and identify, for each of the legs, if the rectifier is short-circuited based on the calculated DC component.

7. The device according to claim 6, wherein the calculating unit is further configured to calculate a maximum DC current and a minimum DC current during the same one period and calculate the ripple value in percent of the estimated DC current based on the calculated maximum and minimum instantaneous DC currents.

8. The device according to claim 7, wherein the calculating unit is further configured to calculate an average DC current based on the measured instantaneous AC currents during the same one period and calculating the ripple value in percent of the estimated DC current based on the calculated maximum instantaneous and minimum instantaneous DC currents and the calculated average DC current.

9. An excitation system for exciting a synchronous rotating electrical machine, wherein the synchronous rotating electrical machine has a rotor, the excitation system comprising,
a transformer having a primary winding and a secondary winding and,
an exciter for exciting the rotor of the synchronous rotating electrical machine and comprising an AC/DC converter including a rectifier circuit comprising at least three legs, wherein each of the legs has an AC input connected to the secondary winding and an DC output connected to the rotor and, each of the legs includes at least one rectifier,
wherein the excitation system further comprises a device according to claim 5 for detecting a failed rectifier in the rectifier circuit.

10. An excitation system according to claim 9, wherein the measuring unit of the device is further configured to measure instantaneous AC current at either the primary winding or the secondary winding.

11. An excitation system according to claim 9, comprising a second transformer having a primary winding and a secondary winding, wherein each of three additional legs of the rectifier circuit has an AC input connected to the secondary winding of the second transformer and an DC output connected to the rotor, and each of the additional three legs comprises at least one rectifier, and the measuring unit is further configured to measure instantaneous AC current flowing through the winding of the second transformer at the same side as the first transformer.

12. An excitation system according to claim 9, wherein the transformer further comprises a tertiary winding and each of three additional legs of the rectifier circuit has an AC input connected to the tertiary winding and the DC output connected to the rotor and the measuring unit is further configured to measure instantaneous AC current at the tertiary winding in case that the measuring unit has configured to measure the secondary winding.

* * * * *